(12) United States Patent
Enda et al.

(10) Patent No.: US 7,902,056 B2
(45) Date of Patent: Mar. 8, 2011

(54) PLASMA TREATED METAL SILICIDE LAYER FORMATION

(75) Inventors: Takayuki Enda, Fukushima-Ken (JP); Tatsuya Inoue, Fukushima-Ken (JP); Naoki Takeguchi, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 13 days.

(21) Appl. No.: 12/195,307

(22) Filed: Aug. 20, 2008

(65) Prior Publication Data
US 2009/0053867 A1   Feb. 26, 2009

(30) Foreign Application Priority Data

Aug. 20, 2007  (JP) .................. 2007-214096

(51) Int. Cl.
*H01L 21/44*  (2006.01)
*H01L 21/28*  (2006.01)

(52) U.S. Cl. ......... 438/582; 438/656; 438/660; 438/664; 257/E21.59; 257/E21.593; 257/E23.072

(58) Field of Classification Search .................. None
See application file for complete search history.

(56) References Cited

U.S. PATENT DOCUMENTS

| | | | | |
|---|---|---|---|---|
| 6,127,270 A | * | 10/2000 | Hu et al. | 438/683 |
| 6,706,626 B2 | * | 3/2004 | Huang | 438/653 |
| 6,943,071 B2 | * | 9/2005 | Fazio et al. | 438/201 |
| 7,064,067 B1 | * | 6/2006 | King et al. | 438/682 |
| 7,479,434 B2 | * | 1/2009 | Kang et al. | 438/301 |

* cited by examiner

*Primary Examiner* — Zandra Smith
*Assistant Examiner* — Khanh B Duong

(57) ABSTRACT

Devices and methods for plasma treated metal silicide layer formation are disclosed. In one embodiment, a method for manufacturing a semiconductor device comprises forming a metal layer on a silicon substrate, exposing the metal layer to a plasma, and thermally treating the silicon substrate and the metal layer to form a metal silicide layer.

19 Claims, 8 Drawing Sheets

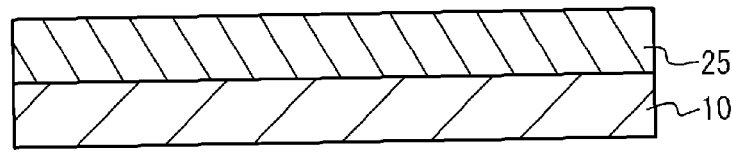
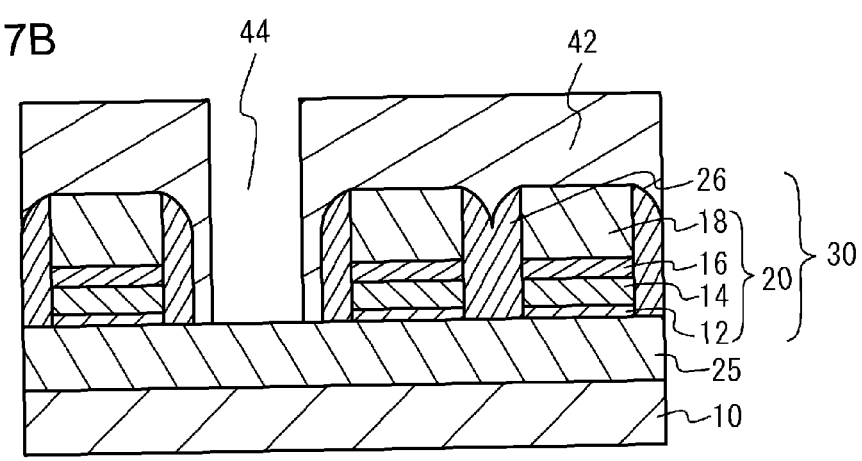
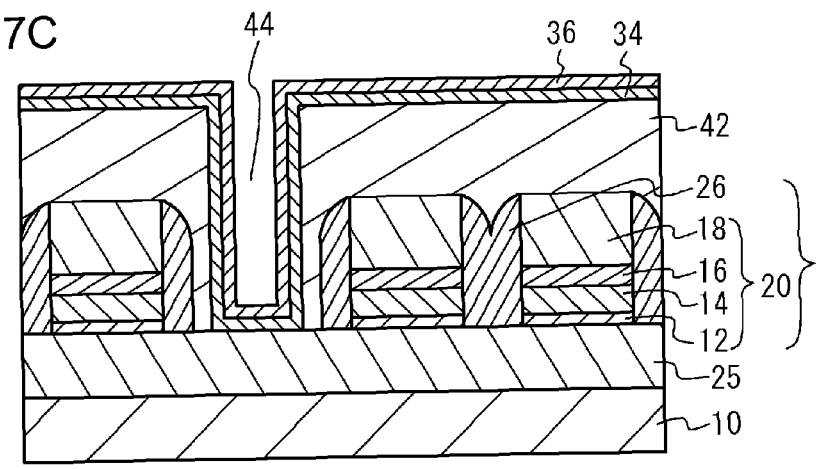

PLASMA TREATED METAL SILICIDE LAYER FORMATION

CLAIM OF PRIORITY

This application claims priority from Japanese patent application 2007-214096 filed on Aug. 20, 2007.

FIELD OF TECHNOLOGY

The present invention relates to semiconductor devices and methods, particularly to electrodes of the semiconductor devices.

BACKGROUND

A metal silicide layer is formed on the surface of a source region, a drain region, and/or a gate electrode of a semiconductor device to reduce resistance. The metal silicide layer may be formed by depositing a metal layer on a silicon layer and by annealing the metal layer and the silicon layer, where the metal layer and the silicon layer react to form the metal silicide layer.

However, as the size of the semiconductor device or chip continues to get smaller, two adjacent silicide layers on two neighboring gate electrodes may come close together, thus creating a short circuit between the neighboring gate electrodes. To avoid the problem, the thickness of the metal layer used to form the metal silicide layer can be reduced. However, the thin metal layer used to form the metal silicide layer can cause an uneven surface or a breakage of the metal silicide layer, thus causing an unexpected variation of the resistance in the metal silicide layer.

SUMMARY

This summary is intended to introduce a selection of concepts in a simplified form that are further described below in the detailed description. This summary is not intended to identify key features or essential features of the claimed subject matter, nor is it intended to be used to limit the scope of the claimed subject matter.

One embodiment of the present invention is directed to a method for manufacturing a semiconductor device which comprises forming a metal layer on a silicon substrate, exposing the metal layer to a plasma, and thermally treating the silicon substrate and the metal layer to form a metal silicide layer.

Another embodiment of the present invention is directed to a method for manufacturing a semiconductor device which comprises forming a metal layer on a silicon substrate, forming a metal nitride layer on the metal layer, exposing the metal nitride layer to a plasma, and thermally treating the silicon substrate and the metal layer to form a metal silicide layer.

Yet another embodiment of the present invention is directed to a method for manufacturing a flash memory device which comprises forming a laminated gate on a silicon substrate, forming a source region and a drain region in the silicon substrate, and forming a sidewall on each side of the laminated gate. In addition, the method comprises forming a metal layer on exposed areas of the silicon substrate and on the laminated gate, forming a metal nitride layer on the metal layer, and thermally treating the silicon substrate, the metal layer, and the metal nitride layer to form a metal silicide layer.

As will be illustrated in the detailed description, other embodiments pertain to systems, methods, and devices for forming a metal silicide having more stable sheet resistance in a semiconductor device. This can be achieved by treating the metal layer deposited on the silicon substrate with a plasma before the metal layer and the silicon substrate are annealed. By doing so, the surface of the metal silicide formed after the annealing process is more even when the metal layer applied on the silicon substrate is thin. Accordingly, the size of the semiconductor device can be further scaled down without sacrificing the grade of the metal silicide.

BRIEF DESCRIPTION OF THE DRAWINGS

Example embodiments are illustrated by way of example and not limitation in the figures of the accompanying drawings, in which like references indicate similar elements and in which:

FIG. 7A through FIG. 8C are sectional views illustrating an exemplary method for manufacturing a flash memory, according to the second embodiment.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments pertain to systems, methods, and devices for forming a metal silicide having more stable sheet resistance in a semiconductor device. This can be achieved by treating the metal layer deposited on the silicon substrate with a plasma before the metal layer and the silicon substrate are annealed. By doing so, the surface of the metal silicide formed after the annealing process is more even when the metal layer applied on the silicon substrate is thin. Accordingly, the size of the semiconductor device can be further scaled down without sacrificing the grade of the metal silicide.

First Embodiment

Figure 1A:
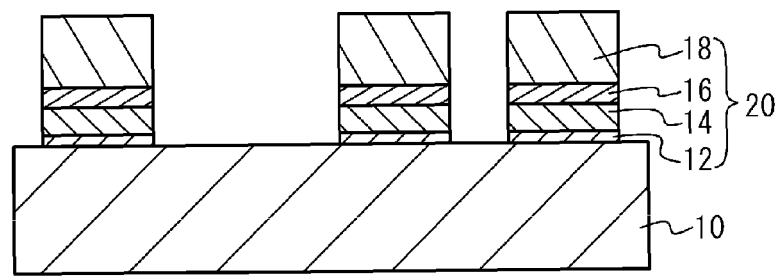
FIG. 1A through FIG. 2C are sectional views illustrating an exemplary method for manufacturing a flash memory, according to the first embodiment.
Figure 1B:
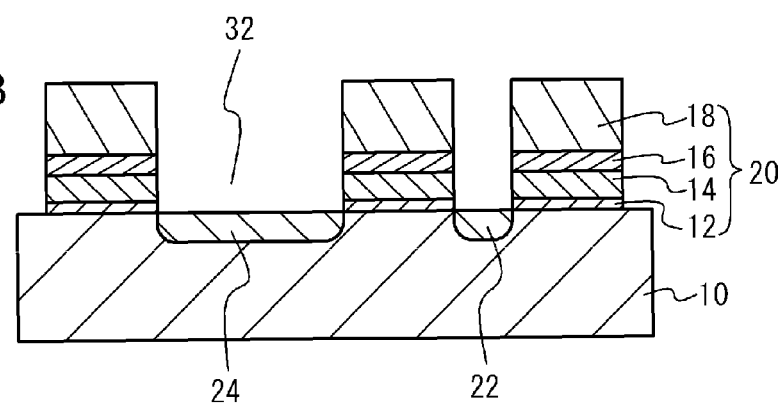

FIG. 1A through FIG. 2C are sectional views illustrating an exemplary method for manufacturing a flash memory, according to the first embodiment. In FIG. 1A, a tunnel oxide film 12 formed of silicon oxide, a floating gate 14 formed of polysilicon, an integrated insulating film 16 formed of an oxide film and a nitride film, and a control gate 18 formed of polysilicon are formed on a p-type silicon substrate 10 (or a p-type region inside the silicon substrate). Thus, a laminated gate 20 that includes the floating gate 14 and the control gate 18 is formed serving as a gate electrode. In FIG. 1B, an arsenic implantation is performed into the silicon substrate 10, using the laminated gate 20 as a mask, to be thermally treated to form a source region 22 and a drain region 24 that are n-type diffusion regions.

Figure 1C:
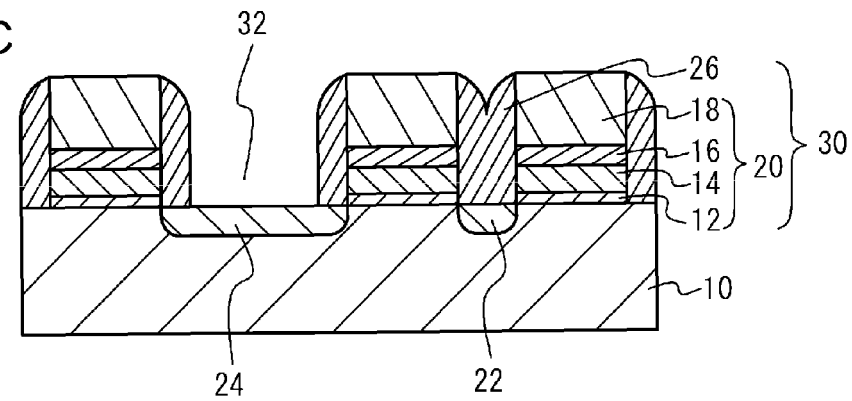

In FIG. 1C, a side wall 26 formed of silicon nitride is formed on each side of the laminated gate 20. Because the width of the source region 22 is narrow, the side walls 26 formed on adjacent side surfaces of the laminated gates 20 are brought into contact with each other. On the other hand, because the width of the drain region 24 is larger than that of the source region 22, the side walls 26 formed on adjacent side surfaces of the laminated gates 20 on both sides of the drain region 24 are not brought into contact with each other. Thus, a mask layer 30 formed of the side walls 26 and the laminated gates 20 have an opening 32.

Figure 2A:
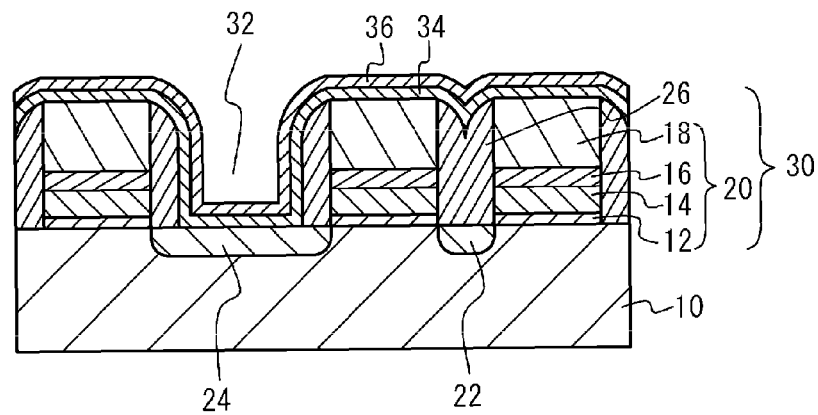
Figure 2B:
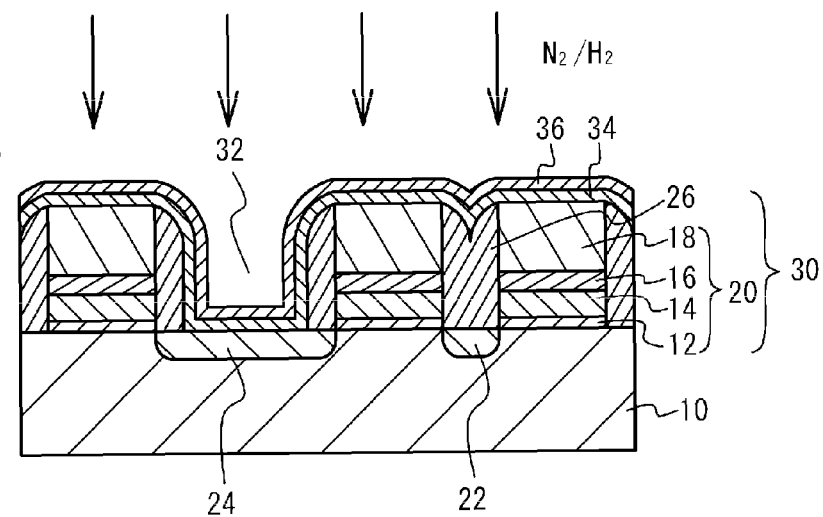
Figure 2C:
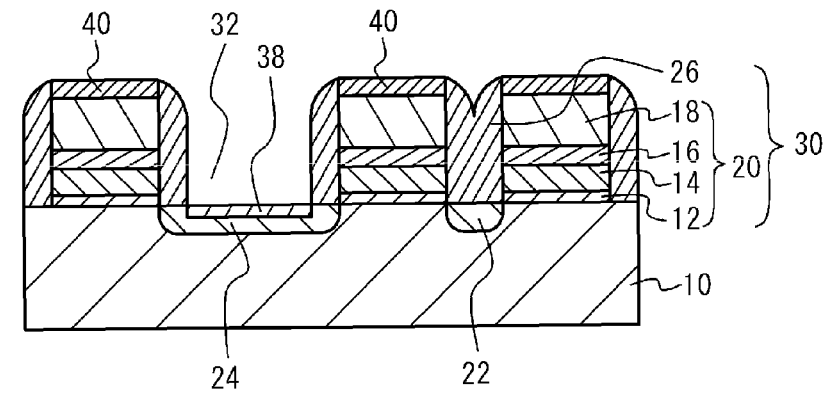

In FIG. 2A, a metal layer 34 of Ti is formed on the silicon substrate 10 in the opening 32 and on the mask layer 30 using a sputtering method, and a metal nitride layer 36 of TiN (titanium nitride) is further formed on the metal layer 34. In FIG. 2B, the metal nitride layer 36 is exposed to a plasma formed of $N_2$ (nitrogen)/$H_2$ (hydrogen). In FIG. 2C, a thermal treatment is performed to cause a reaction between the metal layer 34 and the silicon substrate 10. The residue (e.g., which is not reacted to form a metal silicide layer 40) of the metal layer 34 and the metal nitride layer 36 are eliminated to form a metal silicide layer 38 on the silicon substrate 10 at the bottom surface of the opening 32 (e.g., the drain region 24). The metal silicide layer 40 is further formed on the upper surface of the control gate 18.

Figure 3A:
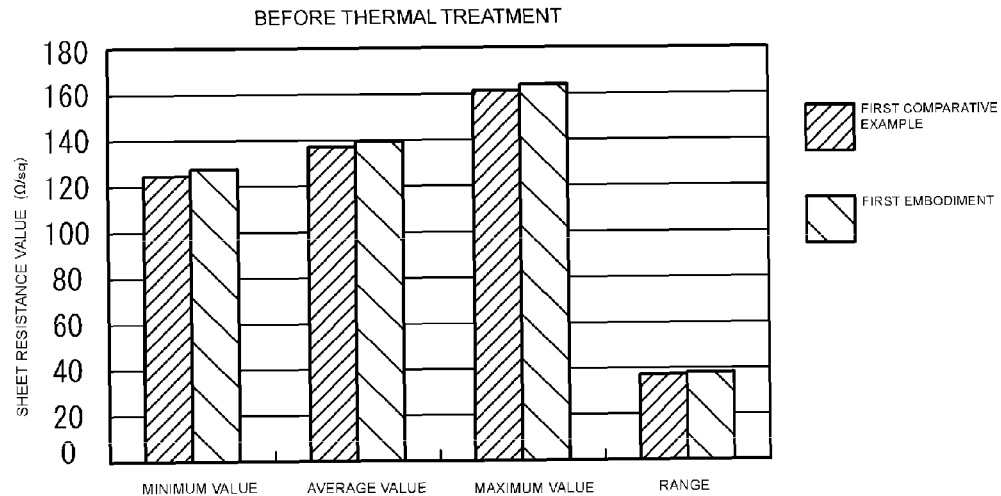
FIG. 3A and FIG. 3B illustrate exemplary sheet resistance values of the metal silicide formed by the method illustrated in FIG. 1A through FIG. 2C and its first comparative example.
Figure 3B:
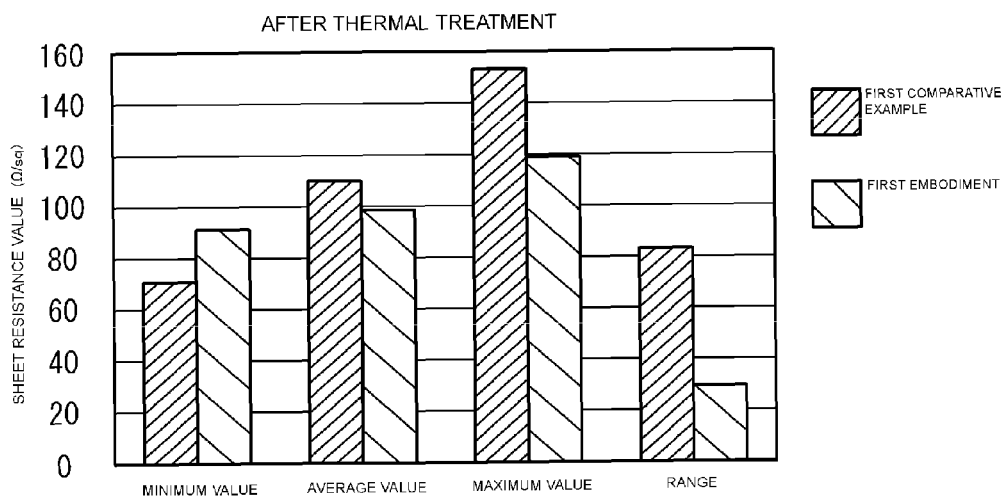

FIG. 3A and FIG. 3B illustrate exemplary sheet resistance values of the metal silicide formed by the method illustrated in FIG. 1A through FIG. 2C and its first comparative example. In the first embodiment, in FIG. 2A, the metal layer 34 has its film thickness of 10 nm, the metal nitride layer has its film thickness of 30 nm, and the temperature is set to 150° C. when the sputtering is performed. In FIG. 2B, the ratio of $N_2$ to $H_2$ is set to 4:6, the pressure is set to 1.3 Torr, and the RF power is set to 750 W. In FIG. 2C, the thermal treatment is performed through a Rapid Thermal Anneal (RTA) method, the temperature for the thermal treatment is set to 600° C., and the time for the thermal treatment is set to 60 seconds. The first comparative example has substantially the same steps as those of the first embodiment except that the metal nitride layer 36 is not exposed to the plasma. The sheet resistance value is measured using a flat wafer.

FIG. 3A shows the sheet resistance values of a laminated film formed of the metal layer 34 and the metal nitride layer 36 with respect to 48 points on the surface of an 8-inch wafer, which are measured before performing the thermal treatment shown in FIG. 2C. The minimum value, the average value, the maximum value and the range correspond to those of the sheet resistance value on the wafer surface. It is appreciated that the range comprises values between the maximum value and the minimum value. In FIG. 3A, the differences of the minimum, average, and maximum sheet resistance values between the first embodiment and the first comparative example are negligible. This shows that the metal layer 34 and the metal nitride layer 36 in the first embodiment are formed in a similar manner as in the first comparative example.

FIG. 3B shows measurement results of the resistance values of the metal silicide layer 38 with respect to 48 points in the wafer surface of the 8-inch wafer in the first embodiment and the first comparative example after the thermal treatment shown in FIG. 2C. The average values of the first embodiment and the first comparative example have hardly changed. However, the minimum sheet resistance value and the maximum sheet resistance value of the first comparative example are significantly greater than their counterparts for the first embodiment after the thermal treatment. That is, the first comparative example shows a large variation in the resistance value on the wafer surface. Meanwhile, in the first embodiment, the variation in the resistance values on the wafer surface is suppressed.

Figure 4A:
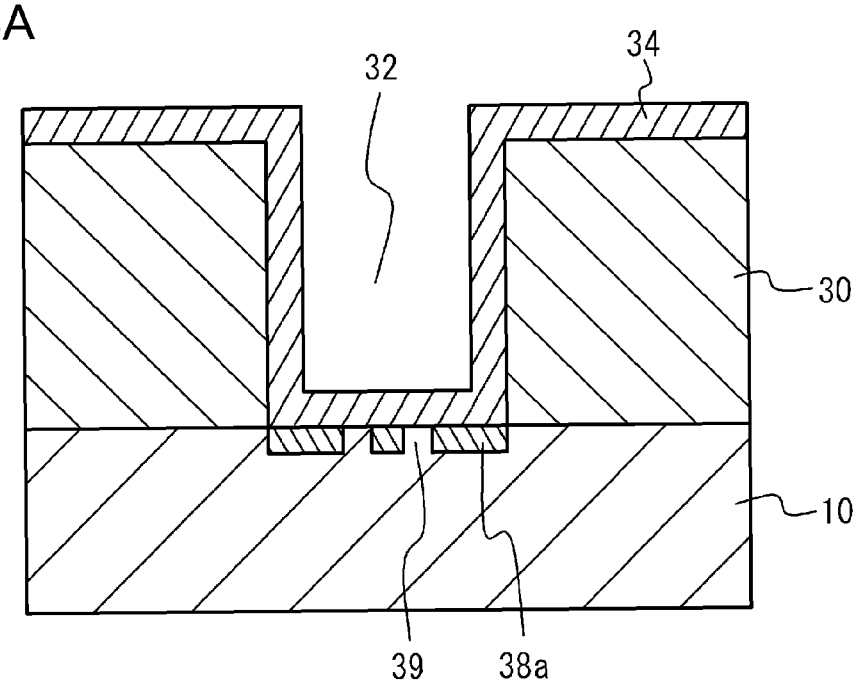
FIG. 4A illustrates a metal silicide layer formed, according to the first comparative example.

FIG. 4A illustrates a metal silicide layer 38a formed according to the first comparative example. In FIG. 4A, the mask layer 30 having the opening 32 is formed above the silicon substrate 10. The metal layer 34 is formed on the inner surface of the opening 32 and on the mask layer 30. When the thermal treatment is performed in the aforementioned state, the silicon substrate 10 and the metal layer 34 are alloyed on the bottom surface of the opening 32 to form the metal silicide layer 38a. However, the surface of the metal silicide layer 38a may be uneven and/or may have a breakage region 39 where no metal silicide is present. Therefore, in the first comparative example, the sheet resistance of the metal silicide layer 38a may vary depending on the shape of the metal silicide layer 38a. The aforementioned variation in the sheet resistance becomes more apparent as the width of the opening 32 is reduced. This occurs because the metal silicide layer 38a is likely to contain one or more breakage regions as the thickness of the metal layer 34 and/or the metal silicide layer 38a needs to be reduced proportional to the reduction of the width of the opening 32.

Figure 4B:
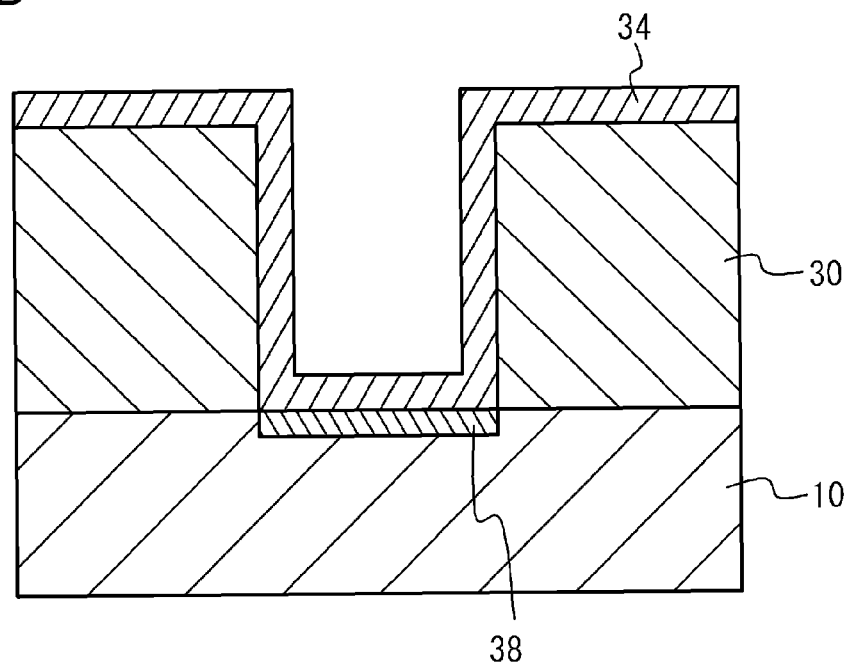
FIG. 4B illustrates an exemplary metal silicide layer, according to the first embodiment.

FIG. 4B illustrates an exemplary metal silicide layer 38 according to the first embodiment. By exposing the metal layer 34 to the plasma before performing the thermal treatment, the formation of the metal silicide layer 38a can be avoided. This makes it possible to form a more stable metal silicide layer 38 while suppressing the variation in its resistance value. More specifically, because the metal layer 34 is exposed to the plasma to reduce oxygen or carbon in the metal layer 34, the metal silicide layer 38 is uniformly formed across the entire length of the opening 32. If the thin metal nitride layer 36 is applied on the metal layer 34, a reduction reaction occurs via the metal nitride layer 36, thus providing the same effects as those derived from the case without the metal nitride layer 36.

Figure 5:
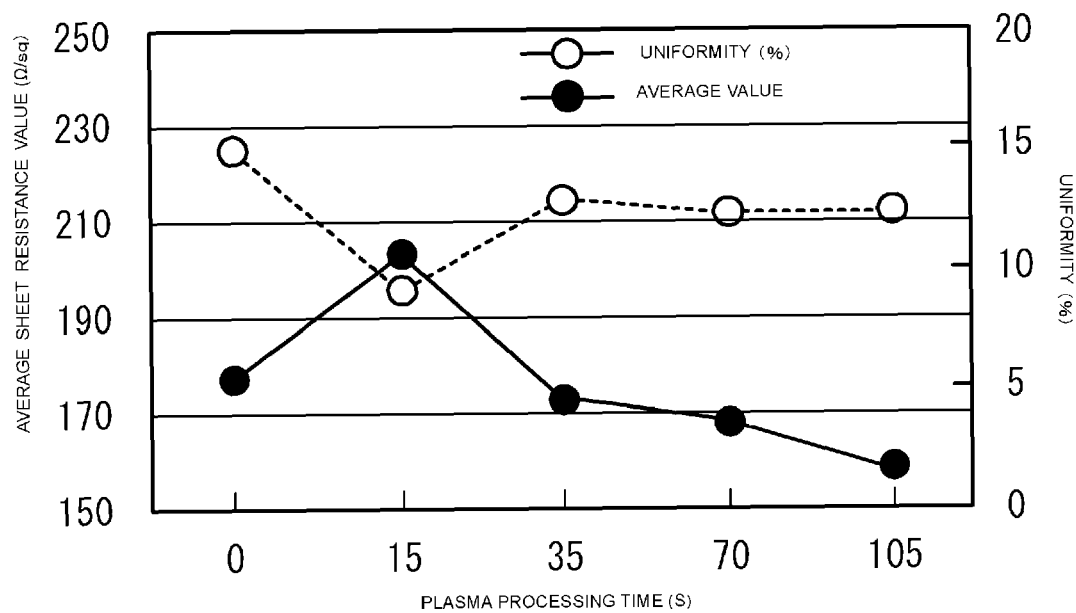
FIG. 5 illustrates exemplary average values of the sheet resistance and the sheet resistance uniformity with respect to the plasma processing time for the metal silicide layer of FIG. 2B.

FIG. 5 illustrates exemplary average values of the sheet resistance and the sheet resistance uniformity with respect to the plasma processing time for the metal silicide layer 38 of FIG. 2B. The uniformity represents the value derived from the equation of (maximum value−minimum value)/(maximum value+minimum value)×100%. The first comparative example corresponds to the state where the plasma processing time is 0 sec. When the plasma processing time becomes 35 seconds or longer, the average value of the sheet resistance and the uniformity become smaller than those of the first comparative example. Preferably, the plasma processing time is set to 35 seconds or longer. It is further preferable to set the radio frequency (RF) power of the plasma to the value ranging from 650 W to 850 W.

Besides $N_2/H_2$ gas used in the first embodiment, any gas may be used as the plasma so long as the reducing gas is contained, where the reducing gas may be formed not only of $H_2$ but also of a gas that contains a hydrogen radical, such as silane. An inactive gas may be contained for attenuating the reducing gas. As an inactive gas, a rare gas, for example, He (helium), Ne (neon), and Xe (xenon), or a gas such as $N_2$ may be used.

The metal layer 34 may be formed of Ti, Co (cobalt), or Ni (nickel), or an alloy formed by combining those metals. In other words, the metal layer may contain at least one of Ti, Co and Ni. This makes it possible to form an appropriate metal silicide layer.

Figure 6:
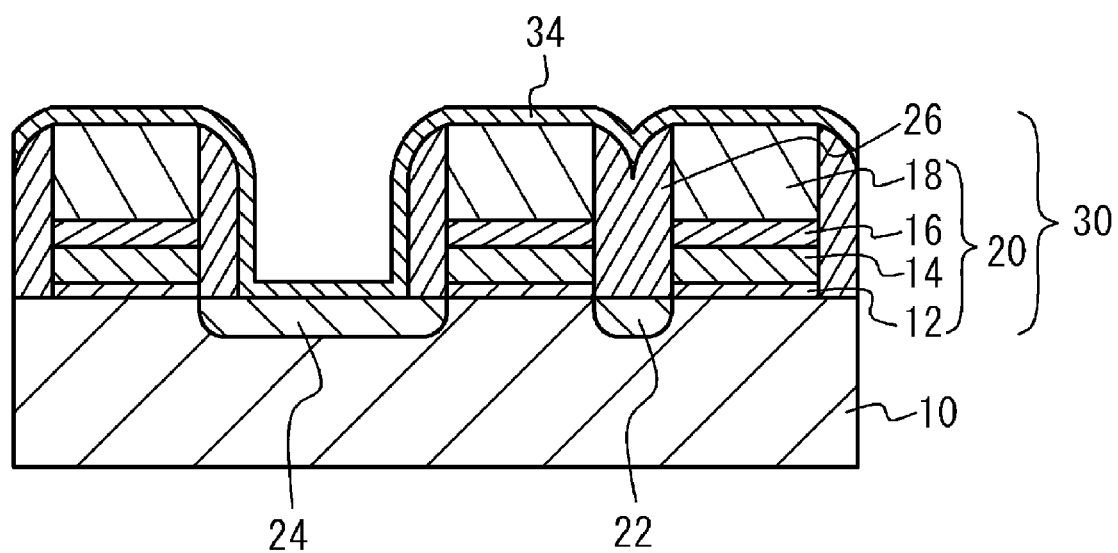
FIG. 6 shows sectional views illustrating an exemplary method for manufacturing a flash memory, according to another example of the first embodiment.

The use of the metal nitride layer 36 is not necessarily required. Unlike FIG. 2A, the metal nitride layer 36 is not shown in FIG. 6. The surface of the metal layer 34 is exposed to the plasma as shown in FIG. 2B in the aforementioned state, and the thermal treatment is performed as shown in FIG. 2C to form the metal silicide layers 38 and 40. The metal silicide layers 38 and 40 may be formed in this manner. However, the formation of the metal nitride layer 36 on the metal layer 34 can suppress oxidation of the metal layer 34 and the like in the middle of the process.

Second Embodiment

FIG. 7A through FIG. 8C are sectional views illustrating an exemplary method for manufacturing a flash memory, according to the second embodiment. In FIG. 7A, arsenic ion implantation is performed into the p-type silicon substrate 10 to form a bit line 25 as an n-type diffusion layer. The laminated gate 20 is formed on the silicon substrate 10 in the same manner as in the first embodiment shown in FIG. 1A. Similar to the step illustrated in FIG. 1C, the side wall 26 is formed on each side surface of the laminated gate 20. An interlayer insulating film 42 of silicon oxide is formed on the laminated gate 20 and the side wall 26. A contact hole 44 connected to the bit line 25 is formed in the interlayer insulating film 42. In FIG. 7C, the metal layer 34 of Ti is formed on the inner surface of the contact hole 44 and on the interlayer insulating film 42 using a sputtering method, and the metal nitride layer 36 of TiN is further formed on the metal layer 34, in the same manner as in FIG. 2A.

Figure 8A:
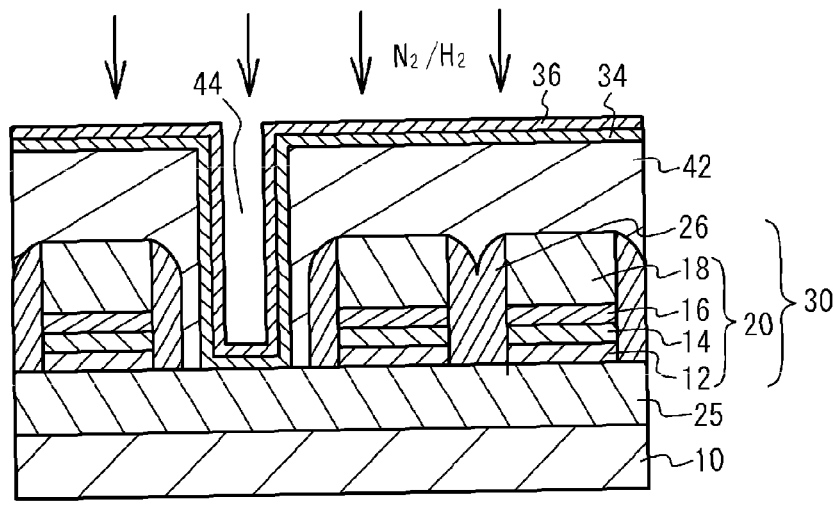
Figure 8B:
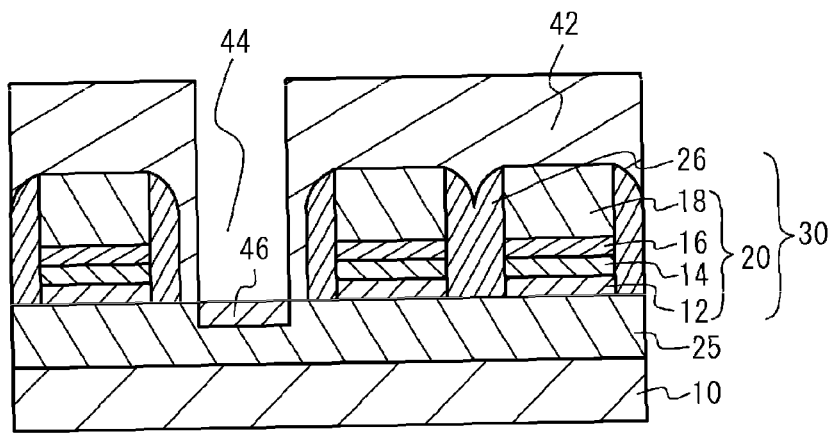
Figure 8C:
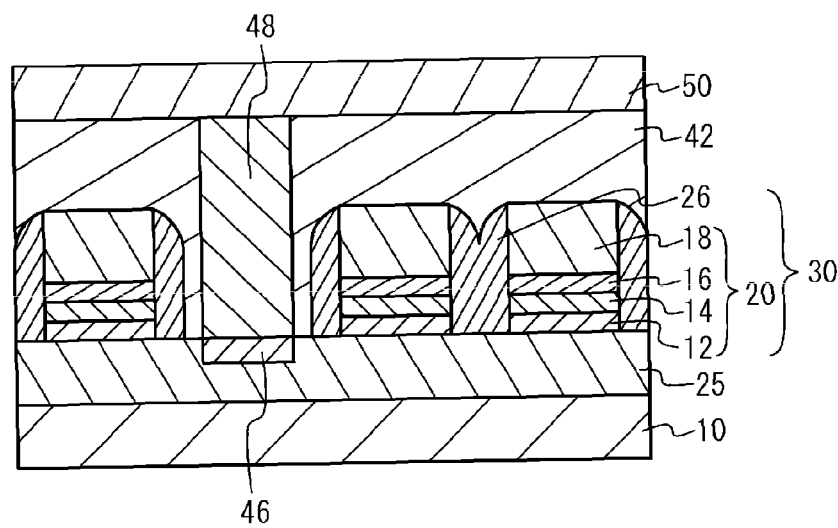

In FIG. 8A, the metal nitride layer 36 is exposed to the plasma formed of $N_2/H_2$ gas in the same manner as shown in FIG. 2B. In FIG. 8B, a thermal treatment is performed to cause a reaction between the metal layer 34 and the silicon substrate 10, and the residue of the metal layer 34 and the metal nitride layer 36 are removed. As a result, the metal silicide layer 46 is formed on the silicon substrate 10 (the bit line 25) on the bottom surface of the contact hole 44. In FIG. 8C, a plug metal 48 formed of W (tungsten) is formed inside the contact hole 44, and a wiring layer 50 connected to the plug metal 48 is further formed. Instead of eliminating the metal nitride layer 36 in the contact hole 44, the metal nitride layer 36 may be used as a barrier layer between the plug metal 48 and the metal silicide layer 46.

The metal silicide formed on the diffusion region such as the drain region and the bit line inside the silicon substrate 10 can be used to suppress the drain resistance and the bit line resistance. In the first and the second embodiments, the metal silicide layers 38 and 46 are mainly formed in the silicon substrate 10. However, the metal silicide layer 40 may be formed inside any silicon layer such as the polysilicon layer as in the first embodiment. It is apparent that the present invention can be applied to a method for manufacturing a semiconductor device other than the floating gate flash memory.

The previous description of the disclosed embodiments is formed to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for manufacturing a flash memory device, comprising:
 forming a laminated gate on a silicon substrate;
 forming a source region and a drain region in the silicon substrate;
 forming a sidewall on each side of the laminated gate;
 forming a metal layer on exposed areas of the silicon substrate and on the laminated gate, wherein the metal layer comprises titanium, cobalt and nickel;
 forming a metal nitride layer on the metal layer;
 exposing the metal nitride layer to a plasma; and
 thermally treating the silicon substrate, the metal layer, and the metal nitride layer to form a metal silicide layer.

2. The method for manufacturing the flash memory device according to claim 1, wherein the forming the laminated gate comprises:
 forming a tunnel oxide film on the silicon substrate;
 forming a floating gate on the tunnel oxide film;
 forming an integrated insulating film on the floating gate; and
 forming a control gate on the integrated insulating film.

3. The method for manufacturing the flash memory device according to claim 1, wherein the forming the source region and the drain region comprises implanting arsenic to the silicon substrate using the laminated gate as a mask.

4. The method for manufacturing the flash memory device according to claim 1, wherein the plasma comprises a reducing gas and an inactive gas.

5. The method for manufacturing the flash memory device according to claim 1, wherein the plasma comprises nitrogen and hydrogen.

6. The method for manufacturing the flash memory device according to claim 1, wherein the metal layer is approximately 10 nm thick and the metal nitride layer is approximately 30 nm thick.

7. The method for manufacturing the flash memory device according to claim 1, wherein the plasma is applied to the metal nitride layer for at least 35 seconds with a radio frequency (RF) power ranging between 650 watts to 850 watts.

8. The method for manufacturing the flash memory device according to claim 1, wherein the plasma comprises a reducing gas.

9. The method for manufacturing the flash memory device according to claim 1, wherein the plasma is applied to the metal layer for at least 35 seconds.

10. The method for manufacturing the flash memory device according to claim 1, wherein the plasma is applied to the metal layer with a radio frequency (RF) power ranging between 650 watts to 850 watts.

11. The method for manufacturing the flash memory device according to claim 1, wherein forming the metal layer on the silicon substrate is performed by a sputtering method.

12. A method for manufacturing a flash memory device, comprising:
   forming a laminated gate on a silicon substrate;
   forming a sidewall on each side of the laminated gate;
   forming an interlayer insulating film on the laminated gate and on the sidewalls;
   forming a contact hole in the interlayer insulating film;
   forming a metal layer on the inner surfaces of the contact hole and on the interlayer insulating film;
   forming a metal nitride layer on the metal layer;
   exposing the metal nitride layer to a plasma; and
   thermally treating the silicon substrate, the metal layer, and the metal nitride layer to form a metal silicide layer.

13. The method for manufacturing the flash memory device according to claim 12, wherein the metal layer comprises at least one of titanium, cobalt and nickel.

14. The method for manufacturing the flash memory device according to claim 12 further comprising forming a bit line into the silicon substrate before forming the laminated gate on the silicon substrate.

15. The method for manufacturing the flash memory device according to claim 14, wherein the contact hole is in contact with the bit line.

16. The method for manufacturing the flash memory device according to claim 12 further comprising forming a plug metal inside the contact hole.

17. The method for manufacturing the flash memory device according to claim 16, wherein the plug metal comprises tungsten.

18. The method for manufacturing the flash memory device according to claim 12, wherein forming the metal silicide layer removes remaining portions of the metal layer and metal nitride layer.

19. The method for manufacturing the flash memory device according to claim 16, wherein forming the metal silicide layer retains remaining portions of the metal nitride layer in the contact hole as a barrier layer between the plug metal and the metal silicide layer.

* * * * *